United States Patent [19]

Parks et al.

[11] 4,184,729
[45] Jan. 22, 1980

[54] FLEXIBLE CONNECTOR CABLE

[75] Inventors: Howard L. Parks, Woodland Hills; John M. Kuronen, Camarillo, both of Calif.

[73] Assignee: Bunker Ramo Corporation, Oak Brook, Ill.

[21] Appl. No.: 841,917

[22] Filed: Oct. 13, 1977

[51] Int. Cl.² .......................... H05K 1/12; H05K 3/36
[52] U.S. Cl. ................................. 339/17 F; 29/625
[58] Field of Search ............ 339/17 F, 17 M, 17 LM, 339/176 MF; 29/625

[56] References Cited

U.S. PATENT DOCUMENTS 3,221,286   11/1965   Fedde ................................. 339/17 F

FOREIGN PATENT DOCUMENTS 1430640   3/1976   United Kingdom ...................... 29/625

OTHER PUBLICATIONS

Hughes Aircraft Co., Connecting Devices Bulletin, Gold Dot, 10-15-1976.

IBM Tech. Bulletin, Hermann, vol. 11, No. 8, p. 962, 1-1969.

Primary Examiner—Neil Abrams
Attorney, Agent, or Firm—F. M. Arbuckle; A. Freilich

[57] ABSTRACT

A flexible connector cable for providing high density and reliable electrical interconnections between printed circuit boards or any other surfaces having conductive paths that need connection to conductive paths on adjacent surfaces. The connector cable comprises a flat flexible laminar structure including an electrically-insulative layer and an electrically-conductive layer. The insulative layer is typically formed on a bonded plastic such as Polyimide and the conductive layer is typically formed of copper. Openings are formed in the insulative layer to expose the conductive layer and raised contacts or buttons are deposited on the conductive layer on both surfaces of the cable. The raised contacts are formed of ductile conductive material which exhibits plastic deformation under pressure to form good electrical connections.

8 Claims, 7 Drawing Figures

FLEXIBLE CONNECTOR CABLE

FIELD OF THE INVENTION

This invention relates generally to electrical connectors and more particularly to a flexible connector cable and method of fabrication thereof for providing high-density and reliable electrical interconnections between conductive paths on substantially-planar surfaces.

BACKGROUND OF THE INVENTION

Various applications exist in which it is desirable to form reliable electrical connections to conductive paths on a substantially-planar surface. For example, it is frequently desired to interconnect printed circuit boards and/or flexible circuits to one another. Such interconnections have generally been formed utilizing substantially-conventional connector structures which are typically bulky, expensive, and insufficiently reliable.

SUMMARY OF THE INVENTION

The present invention is directed to a flexible connector cable, and method of fabrication thereof, useful for interconnecting conductive paths on substantially-planar surfaces.

In accordance with a preferred embodiment of the invention, a flat flexible laminar cable structure is provided comprised of electrically-insulative and electrically-conductive layers bonded to one another. The conductive layer is etched or otherwise formed to create desired circuit paths. The insulative layer is etched or otherwise formed to expose areas of the conductive layer where connections are to be made.

In accordance with a significant aspect of the preferred embodiment, conductive contacts or bumps are formed on opposite surfaces of the cable wherever connections are to be made. The contacts are preferably formed on a ductile material, e.g., gold, which exhibits plastic deformation under applied pressure to form good electrical connections to a contiguous surface.

The novel features of the invention are set forth with particularity in the appended claims. The invention will best be understood from the following description when read in conjunction with the accompanying drawings.

DESCRIPTION OF THE PREFERRED EMBODIMENT

Figure 1:
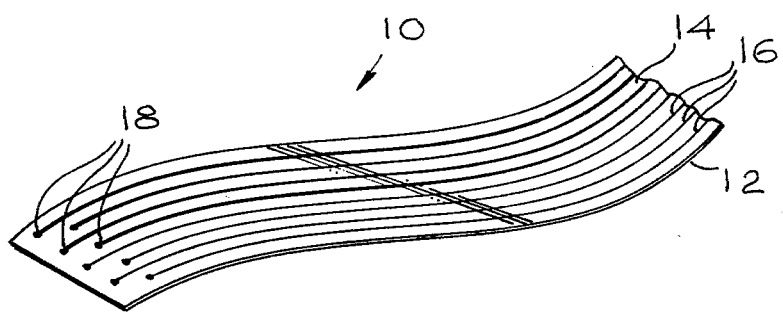
FIG. 1 is a perspective representative view of a flexible connector cable in accordance with the present invention.
Figure 2:
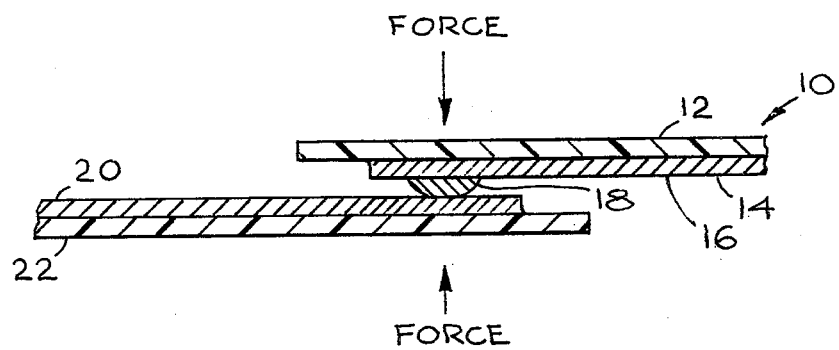
FIGS. 2 and 2A are enlarged sectional views, each partially broken away, illustrating a connector cable in accordance with the present invention, respectively connected to conductive paths on a single circuit board and on a pair of circuit boards.
Figure 2A:
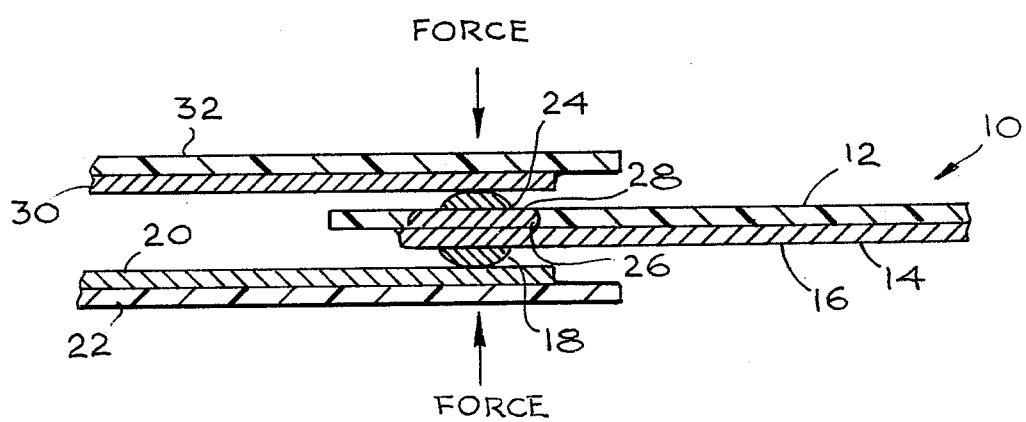

Attention is now directed to FIGS. 1, 2, and 2A which illustrate a flexible connector cable 10 in accordance with the present invention for forming electrical connections to conductive paths on planar surfaces. Briefly, the connector cable 10 comprises a laminar structure formed by the layer 12 of flexible electrically-insulative material and a layer 14 formed of flexible electrically-conductive material.

As will be discussed in greater detail hereinafter, the layer 12 of insulative material comprises a strength member which supports the conductive layer 14 which is configured to define electrically-isolated circuit paths 16. In accordance with one significant aspect of the invention, the circuit paths 16 have raised contacts 18 deposited thereon which are intended to contact conductive paths 20 on a planar circuit board 22. In accordance with an important aspect of the invention, as depicted in FIG. 2A, contacts 24 are also formed on the cable on the surface thereof opposite to the surface carrying the contacts 18.

As can be seen in FIG. 2A, a void or opening 26 is formed in the insulative layer 12 which exposes therethrough the conductive layer 14. The conductive layer 14 is preferably built up by plating and the contact 24 is deposited on the builtup portion 28. Thus, with the contacts 18 and 24 extending from opposite surfaces of the cable 10, connections can be made simultaneously to the conductive path 20 on circuit board 22 and to the conductive path 30 on circuit board 32. Where through-connections are desired, the contacts 18 or 24 will be aligned and connected to the same circuit path 16. Where through-connections are not desired, it is only necessary to provide a contact on one surface of the circuit path 16. The ability to provide contacts extending from opposite surfaces of the cable makes it exceedingly useful to provide high-density connections to conductive paths on planar circuit boards as depicted in FIG. 2A. Although the invention has maximum utility for such high-density applications, it is nevertheless also extremely useful for connecting to any single planar surface as depicted in FIG. 2. It will, of course, be understood that a suitable clamping means (not shown) must be provided to press the cable against the circuit board, but a variety of such means can be used. In its simplest form, the clamping means can merely comprise a rigid clamp which bears against the cable and is bolted to the circuit board. The contacts 18 and 24 are preferably formed of a ductile material, such as gold, which exhibits plastic deformation when placed under a sufficient clamping force. For example, application of the clamping force represented by the two force arrows in FIG. 2 causes the surface of the gold contacts 18 and 24 to minutely flow or deform, thus producing very good and reliable electrical connections to the conductive paths 20 and 30.

Figure 3:
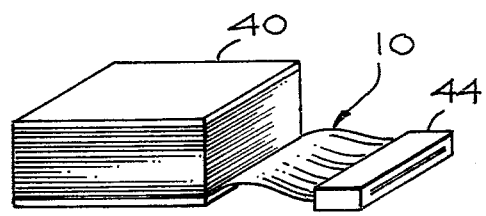
FIG. 3 is a perspective representative view illustrating one application of a flexible connector cable in accordance with the present invention.

A flexible connector cable constructed in accordance with the present invention finds use in many applications for electrically connecting to conductive portions of planar surfaces. A somewhat unusual but significant application of the flexible cable 10 is illustrated in FIG. 3 in which the cable is used to provide electrical connection to conductive areas within a stack 40 of rigid wafers of the type disclosed in such prior art patents as U.S. Pat. No. 3,705,332. The cited patent discloses an electrical circuit packaging structure in which a plurality of electrically-conductive wafers are stacked together under pressure and in which X-Y axis conductors are formed within each wafer and Z-axis slugs are provided to interconnect wafers. When using such a wafer stack, it is sometimes desirable to be able to bring out circuit paths from within the stack to some external device. This is the arrangement represented in FIG. 3 in which the flexible cable 10 of FIG. 1 is represented as entering the stack 40. The end of the cable 10 remote from the stack 40 is shown as terminating in a conventional connector 44 which can then be connected to some external device (not shown).

Figure 4:
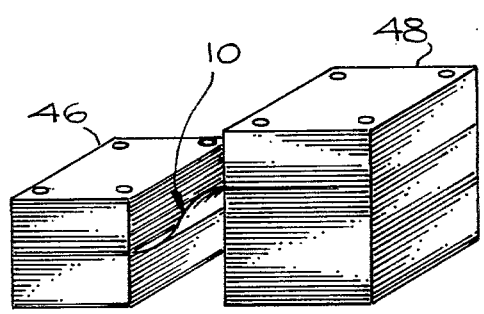
FIG. 4 is a perspective representative view illustrating another application of a connector cable in accordance with the present invention.

FIG. 4 illustrates a similar but somewhat different application of the flexible cable 10 for interconnecting two wafer stacks 46 and 48 of the type described in the aforementioned U.S. Pat. No. 3,705,332.

Figure 5:
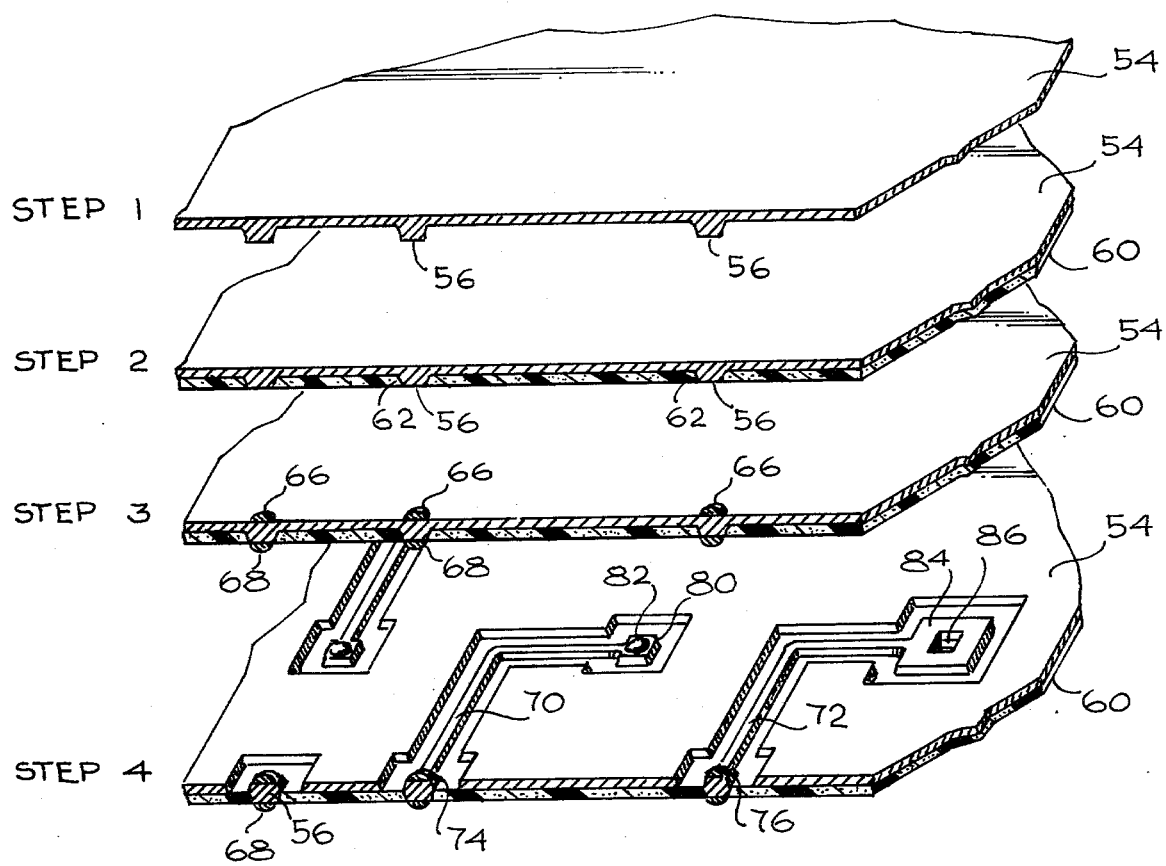
FIG. 5 illustrates a sequence of process steps in accordance with one procedure for fabricating an embodiment of the invention.

Attention is now directed to FIG. 5 which illustrates a preferred method of fabricating a flexible cable in accordance with the present invention. The method of FIG. 5 contemplates starting out with a copper sheet having a thickness on the order of 3 mils.

In step 1, the copper sheet is etched by well-known photographic and chemical etching procedures, to a thickness on the order of 1 mil leaving mesas 56 wherever connections are to be made.

In step 2, a sheet 60 of electrically insulative material, having openings 62 to accommodate the mesas 56, is bonded to the copper sheet 54. The electrically-insulative sheet 60 functions as a strength member to support the circuit paths to be ultimately formed by the copper layer 54. The sheet 60 preferably comprises a bonded plastic such as Polyimide having a thickness on the order of 1 mil. The voids or openings 62 therein for accommodating the mesas 56 can be formed either by chemical etching or by some mechanical means such as a punch. Still in step 2, the insulative layer 60 is preferably sanded to assure that the mesa surfaces are contiguous with the surface of the insulative sheet 60.

In step 3, gold contact buttons 66, 68 are plated both on the conductive layer 54 and the exposed surfaces of mesas 56 wherever connections are ultimately to be made.

In step 4, the desired circuit pattern is formed on the conductive layer 54, preferably by photographic and chemical etching procedure. In the simplest configuration, as is generally depicted in FIG. 1, the conductive layer 54 can be processed to merely form a plurality of parallel electrically-isolated conductors. However, more complex circuit patterns as are depicted in FIG. 5 can be defined for special applications. For example, FIG. 5 shows the formation of conductive paths 70 and 72 which respectively extend from the plated contacts 74 and 76, each path constituting an island electrically isolated from the remainder of the conductive layer 54. Note that each of the paths 70 and 72 has been formed by removing portions of the conductive layer 54, as by chemical etching, along both sides of the paths leaving portions of layer 54 to form the paths 70 and 72. The paths 70, 72 are essentially fully surrounded by the remaining portions of the conductive layer 54 which remaining portions thus form a ground plane. The fact that a flexible connector cable in accordance with the present invention can be fabricated to include a ground plane around the conductive paths 70, 72, makes it quite compatible with Planar Coax technology (as, for example, described in the aforecited U.S. Pat. No. 3,705,332) allowing impedance-controlled stripline structures to be interconnected. It should, of course, be apparent that where ground plane systems are not required, all of the conductive layer 54 can be removed except for those portions which are left to define the desired circuit paths.

FIG. 5 illustrates circuit path 70 terminating in a mesa 80 having a contact 82, remote from the contact 74. Alternatively, FIG. 5 illustrates conductive path 72 terminating in a ring of conductive material 84, electrically isolated from the ground plane material of conductive layer 54. The ring of material 84 surrounds a hole 86 which can be utilized to receive a lead or pin, for example, which can then be soldered to the ring of material 84.

Figure 6:
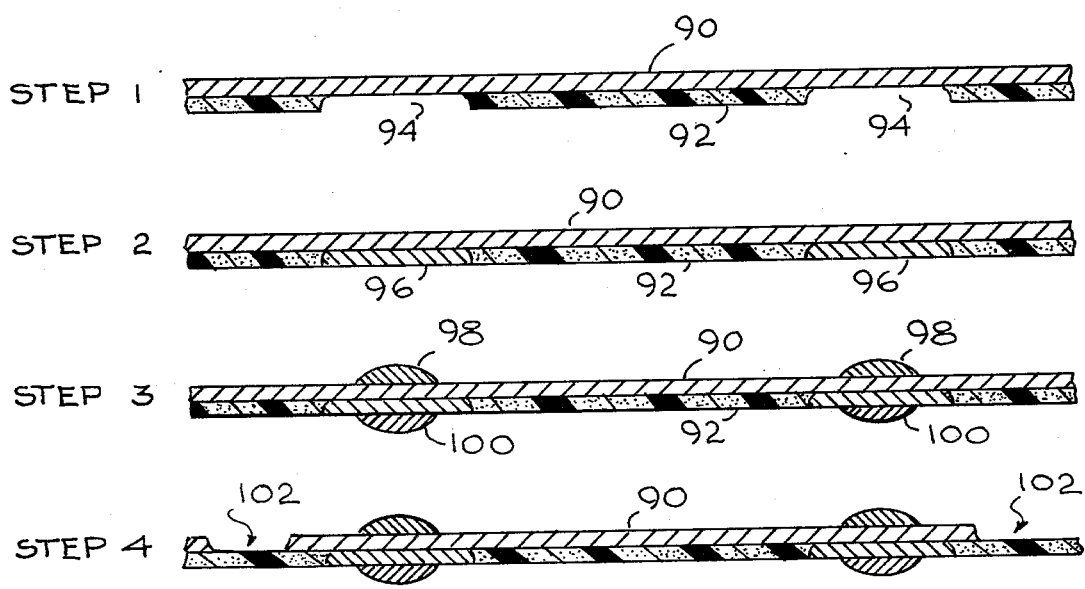
FIG. 6 illustrates an alternative sequence of process steps for fabricating a connector cable in accordance with the present invention.

An alternative method of fabricating a flexible cable connector in accordance with the invention is illustrated in FIG. 6. Step 1 depicts the bonding together of a 1-mil sheet of copper 90 and a 1-mil sheet of flexible electrically-insulative material, such as Polyimide 92. Note that the sheet 92 is shown with the openings or voids 94 formed therein. These openings 94 can be formed either by an appropriate mechanical procedure or chemical etching. In step 2 of FIG. 6 copper 96 is plated through the opening 94 of the insulative layer 92 to electrically connect to the conductive layer 90. Thereafter, in step 3, gold contacts 98 are plated on the upper surface of the cable structure and gold contacts 100 are plated on the lower surface of the cable structure. As illustrated, the plated contacts can provide connections directly through the cable structure where desired.

In step 4 the conductive layer 90 is appropriately etched, as at 102 to form the desired circuit pattern.

From the foregoing, it should now be apparent that a flexible connector cable has been disclosed herein suitable for providing high-density connections as well as high-reliability connections to conductive paths on planar structures. The cable can be inexpensively and precisely fabricated by a sequence of well-known techniques such as bonding and chemical etching. Moreover, the construction of the cable is such that it lends itself to fabrication by automatic or batch procedures. For example only, it should be apparent that the connector cable can be processed in long ribbon structures.

Although particular embodiments of the invention have been described and illustrated herein, it is recognized that modifications and variations may readily occur to those skilled in the art and consequently, it is intended that the claims be interpreted to cover such modifications and equivalents.

The embodiments of the invention in which an exclusive property or privilege is claimed are described as follows:

1. An interconnection cable useful for electrically connecting to multiple points on a substantially-planar circuit board, said cable comprising:
    a flat flexible laminar structure including first and second material layers bonded to one another;
    said first material layer being formed of a flexible electrically-insulative material;
    said second material layer being formed of a thin flexible layer of electrically-conductive material;
    said second material layer including an electrically continuous ground plane portion and one or more circuit path portions each physically spaced and electrically isolated from said ground plane portion and from each other circuit path portion, said ground plane and circuit path portions being physically configured so that each circuit path portion forms an island substantially surrounded by but electrically isolated from said ground plane portion;

first raised contacts formed of electrically-conductive material deposited on each of said circuit path portions remote from said first material layer;

said first material layer having voids formed therein to expose portions of said second material layer therethrough; and second raised contacts formed of electrically-conductive material deposited on said exposed portions of said second material layer.

2. The cable of claim 1 wherein at least one of said first raised contacts is positioned in alignment with one of said second raised contacts.

3. The cable of claim 1 wherein said first raised contacts are formed of a ductile material capable of exhibiting plastic deformation when forced against said circuit board.

4. The cable of claim 1 wherein each of said first raised contacts is aligned with one of said second raised contacts; and wherein said raised contacts are formed of a ductile material capable of exhibiting plastic deformation when forced against a circuit board.

5. A cable structure useful for forming an electrical connection to a circuit path on a substantially-planar surface, said cable structure comprising:

first and second substantially flat contiguous coextensive layers, said first layer being formed of flexible electrically-insulative material having opposite first and second substantially planar surfaces, said second layer being formed of flexible electrically-conductive material having a first planar surface bonded to said first layer first planar surface;

said second layer including a first electrically continuous portion and one or more second portions each physically spaced and electrically isolated from said first portion and from each other second portion, said first and second portions being physically configured so that each second portion forms an island substantially surrounded by but electrically isolated from said first portion;

at least one raised contact formed of electrically-conductive material deposited on each of said second layer second portions on the surface thereof remote from said first layer, each such raised contact being formed of a material more ductile than said second layer whereby said contact will exhibit plastic deformation in response to a force applied thereto essentially normal to said second layer;

said first layer including voids therein exposing said second layer therethrough; and at least one raised contact formed of electrically-conductive material deposited on the portion of said second layer exposed through said first layer voids.

6. The structure of claim 5 wherein said raised contact deposited on said exposed portion of said second layer is aligned with a raised contact deposited on said second layer second surface to thereby produce a through-connection through said cable.

7. The structure of claim 5 wherein said second layer is formed of copper.

8. The structure of claim 5 wherein said first layer is formed of Polyimide.

* * * * *